(12) United States Patent
Wang et al.

(10) Patent No.: US 11,573,556 B2
(45) Date of Patent: Feb. 7, 2023

(54) SIGNAL GAIN DETERMINATION CIRCUIT AND SIGNAL GAIN DETERMINATION METHOD

(71) Applicant: ANPEC ELECTRONICS CORPORATION, Hsinchu (TW)

(72) Inventors: Yu-Wen Wang, Hsinchu (TW); Jia-Hua Hong, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 195 days.

(21) Appl. No.: 17/141,161

(22) Filed: Jan. 4, 2021

(65) Prior Publication Data
US 2022/0083028 A1 Mar. 17, 2022

(30) Foreign Application Priority Data
Sep. 15, 2020 (TW) ................................ 109131763

(51) Int. Cl.
*H03G 1/00* (2006.01)
*G05B 19/4155* (2006.01)
*G01R 27/28* (2006.01)
*H03G 3/00* (2006.01)

(52) U.S. Cl.
CPC ......... *G05B 19/4155* (2013.01); *G01R 27/28* (2013.01); *H03G 1/0088* (2013.01); *H03G 3/001* (2013.01); *G05B 2219/34292* (2013.01)

(58) Field of Classification Search
CPC .. H03G 1/0088; H03G 3/001; H03F 3/45475; H03K 21/10
USPC .............................. 330/279, 277, 308, 9, 10
See application file for complete search history.

(56) References Cited

U.S. PATENT DOCUMENTS 4,225,976 A * 9/1980 Osborne .............. H04B 1/7075
375/150

FOREIGN PATENT DOCUMENTS

TW          201027910 A1     7/2010
TW          I699973 B        7/2020

* cited by examiner

*Primary Examiner* — Hafizur Rahman
*Assistant Examiner* — Khiem D Nguyen
(74) *Attorney, Agent, or Firm* — Li & Cai Intellectual Property Office

(57) ABSTRACT

A signal gain determination circuit including a digital comparator, a digital controller and an arithmetic module, and a signal gain determination method are provided. A sensing integration circuit generates a first count during a first integration time according to a first sensing signal. The digital comparator compares the first count and a predetermined count to generate a comparison result. The digital controller generates a control signal for indicating a signal gain to a signal amplifier of the sensing integration circuit according to the comparison result. The signal amplifier adjusts the first sensing signal according to the signal gain to generate a second sensing signal, so that the sensing integration circuit generates a second count corresponding to the second sensing signal during a second integration time. The arithmetic module generates an output count corresponding to the first sensing signal according to the second count and the signal gain.

16 Claims, 9 Drawing Sheets

SIGNAL GAIN DETERMINATION CIRCUIT AND SIGNAL GAIN DETERMINATION METHOD

CROSS-REFERENCE TO RELATED PATENT APPLICATION

This application claims the benefit of priority to Taiwan Patent Application No. 109131763, filed on Sep. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a signal gain determination circuit and a signal gain determination method, and more particularly to a signal gain determination circuit and a signal gain determination method for a sensing integration circuit.

BACKGROUND OF THE DISCLOSURE

Among conventional sensors (e.g., sensors for sensing light, pressure, electricity, temperature, etc.), such as a light sensor, during a predetermined integration time, an accumulator is reset once an integral voltage charged by an original sensing signal is ramped up to a predetermined reference voltage, and a number of times that the integral voltage is ramped up to the reference voltage is concurrently accumulated by a counter. A count corresponding to the original sensing signal during the predetermined integration time can be obtained by reading the number of times accumulated by the counter after the predetermined integration time elapses.

FIG. 1 is a schematic view of a curve CN_1 showing count versus SNR (signal-to-noise ratio) of a conventional sensing integration circuit. In practice, it has been observed that a signal strength of a noise floor is usually within a certain range, and the signal strength of the noise floor is not linearly proportional to a signal strength of the original sensing signal. In detail, as shown in FIG. 1, when the conventional sensor operates with the sensing signal having a small signal strength, the signal strength of the noise floor is a higher proportion of the sensing signal to result in a poorer SNR. On the other hand, when the conventional sensor operates with the sensing signal having a great signal strength, the signal strength of the noise floor is a lower proportion of the sensing signal to result in a better SNR.

FIG. 2 is a schematic view of a curve CS_1 showing sensing signal versus count of the conventional sensing integration circuit. When change is occurring in the sensing signal, the obtained count may not be linearly proportional to the sensing signal as shown in FIG. 2, and a slope of the curve CS_1 is not constant. Consequently, a linearity of the conventional sensing integration circuit may not meet strict linearity requirements for some products.

In short, since the signal strengths of the noise floor and the original sensing signal are not linearly proportional, the SNR of the conventional sensor is not uniformly distributed among a plurality of sensing signal ranges; in addition, when change is occurring in the sensing signal, the count generated by the conventional sensing integration circuit is not linearly proportional to the sensing signal, so that the conventional sensing integration circuit may not meet the strict linearity requirements for some products.

Therefore, how to improve uniformity of the SNR and the linearity of the conventional sensor when the sensor operates within a plurality of sensing signal ranges has become one of the critical topics in the industry.

SUMMARY OF THE DISCLOSURE

In response to the above-referenced technical inadequacies, the present disclosure provides a signal gain determination circuit and a signal gain determination method, so as to improve uniformity of SNR (signal-to-noise ratio) and linearity of a sensor.

In one aspect, the present disclosure provides a signal gain determination circuit configured for a sensing integration circuit. The signal gain determination circuit includes a first register, a second register, a digital comparator, a digital controller, a third register, an arithmetic module and a fourth register. The first register is configured to store a predetermined count. The second register is configured to store a first count. The sensing integration circuit generates the first count according to a first sensing signal during a first integration time. The digital comparator is coupled to the first register and the second register, and configured to compare the first count with the predetermined count to generate a comparison result after the first integration time. The digital controller is coupled to the digital comparator, and configured to determine a signal gain according to the comparison result so as to generate a control signal for indicating the signal gain to a signal amplifier of the sensing integration circuit. The signal amplifier is configured to adjust the first sensing signal according to the signal gain to generate a second sensing signal, so that the sensing integration circuit is configured to generate a second count corresponding to the second sensing signal during a second integration time, and the second register is configured to store the second count after the second integration time. The third register is coupled to the digital controller, and configured to store the signal gain. The arithmetic module is coupled to the third register and the second register, and configured to generate an output count corresponding to the first sensing signal according to the second count and the signal gain after the second integration time. The fourth register is coupled to the arithmetic module, and configured to store the output count.

In another aspect, the present disclosure provides a signal gain determination method for a sensing integration circuit. The signal gain determination method includes: configuring the sensing integration circuit to generate a first count corresponding to a first sensing signal during a first integration time; comparing the first count with a predetermined count to generate a comparison result after the first integration time; determining a signal gain according to the comparison result to generate a control signal for indicating the signal gain; adjusting the first sensing signal according to the signal gain to generate a second sensing signal; configuring the sensing integration circuit to generate a second count corresponding to the second sensing signal during a second integration time; and generating an output count corresponding to the first sensing signal according to the second count and the signal gain after the second integration time.

Therefore, by virtue of "comparing a first count corresponding to a first sensing signal with a predetermined count to determine a signal gain corresponding to the first sensing signal during a first integration time; adjusting the first sensing signal according to the signal gain to generate a second sensing signal; generating a second count corresponding to the second sensing signal during a second integration time; and generating an output count corresponding to the first sensing signal according to the second count and the signal gain after the second integration time", the SNR of the sensor may be uniformly distributed among an overall operating range, and the linearity of the sensor can be improved as well.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
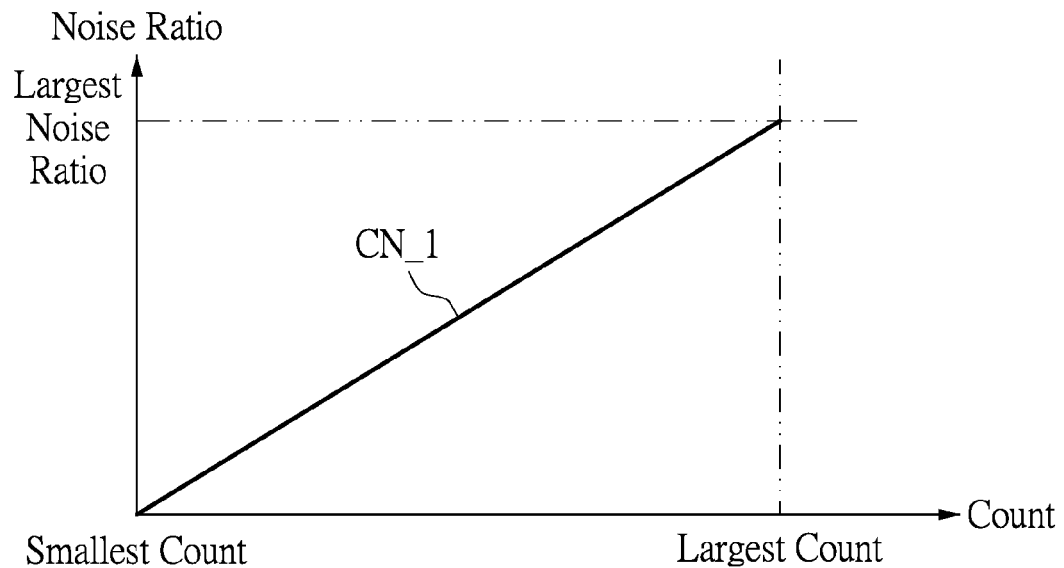
FIG. 1 is a schematic view of a curve showing count versus SNR of a conventional sensing integration circuit.
Figure 2:
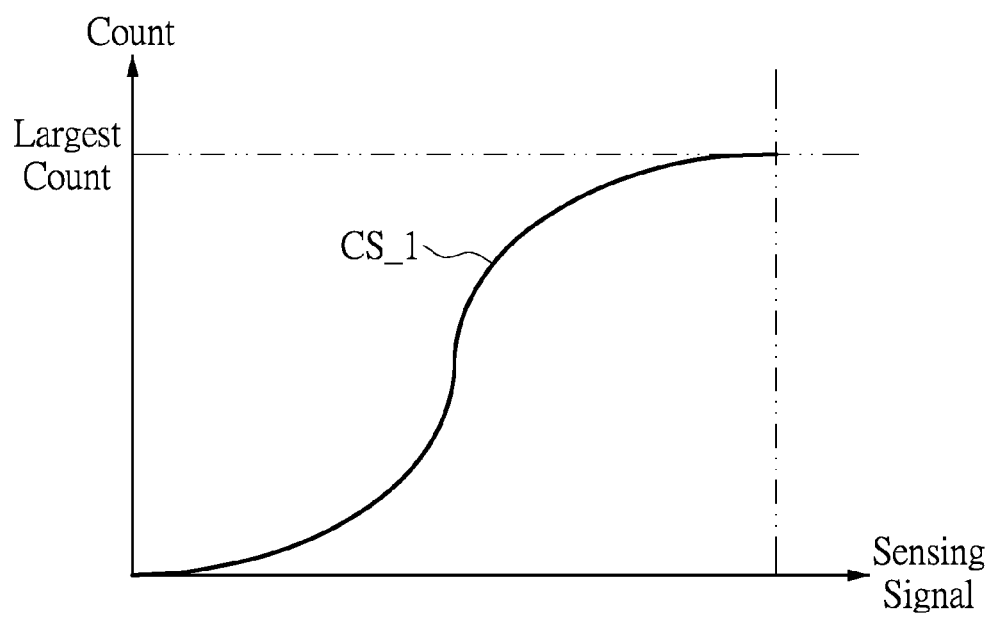
FIG. 2 is a schematic view of a curve showing sensing signal versus count of the conventional sensing integration circuit.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 3:
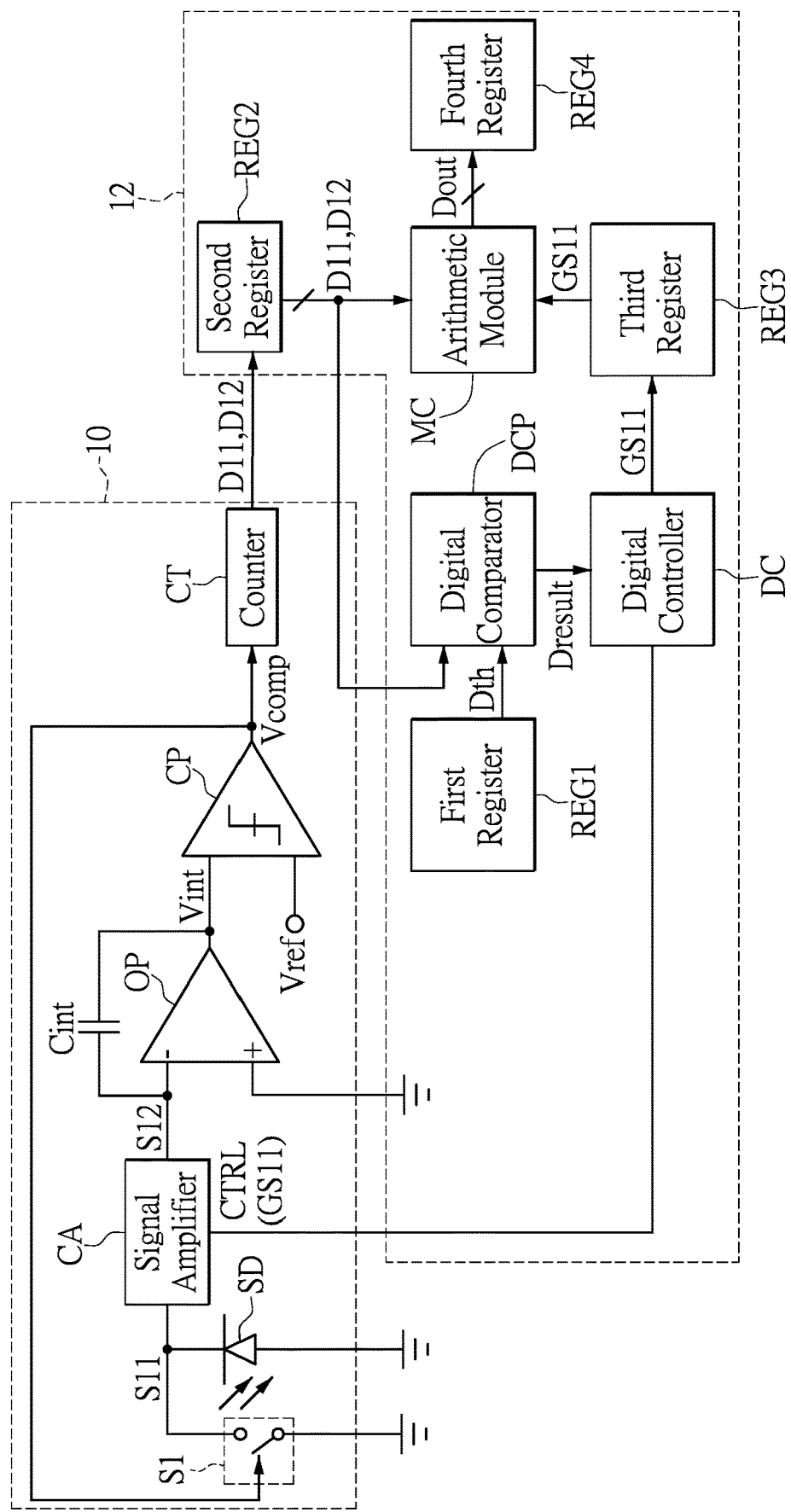
FIG. 3 is a functional block diagram of a sensing integration circuit and a signal gain determination circuit according to a first embodiment of the present disclosure.

FIG. 3 is a functional block diagram of a sensing integration circuit 10 and a signal gain determination circuit 12 according to a first embodiment of the present disclosure. A circuit structure of the sensing integration circuit 10 is shown in FIG. 3, and the sensing integration circuit 10 includes a reset switch S1, a sensing unit SD, a signal amplifier CA, an operational amplifier OP, an integral capacitor Cint, a comparator CP, and a counter CT. The sensing unit SD may be a photodiode, and is configured to generate a first sensing signal S11 (e.g., a light sensing current) to the signal amplifier CA. In other embodiments, the sensing unit SD may be, but is not limited to, a sensor for sensing pressure, temperature or electricity. During a first integration time T1 (shown in FIG. 4), a gain of the signal amplifier CA is preset to 1, so that the first sensing signal S11 will not be adjusted. Further, the integral capacitor Cint is charged by the first sensing signal S11 to generate an integral voltage Vint at an output terminal of the operational amplifier OP and a first input terminal of the comparator CP. A second input terminal of the comparator CP is configured to receive a reference voltage Vref. An output terminal of the comparator CP generates a comparison voltage Vcomp every time the integral voltage Vint ramps up to the reference voltage Vref, and then the reset switch S1 resets the sensing unit SD according to the compare voltage Vcomp (e.g., a cathode of the sensing unit SD and an input terminal of the signal amplifier CA are grounded to discharge the integral voltage Vint of the integral capacitor Cint to zero volts). Meanwhile, the counter CT adds a value of 1 to a cumulative count according to the compare voltage Vcomp every time the integral voltage Vint ramps up to the reference voltage Vref. When the first integration time T1 elapses, the counter CT outputs the cumulative count (i.e., a first count D11) to the signal gain determination circuit 12. In short, the sensing integration circuit 10 allows the counter CT to generate the first count D11 to the signal gain determination circuit 12 according to the first sensing signal S11 generated by the sensing unit SD during the first integration time T1.

The signal gain determination circuit 12 is coupled to the sensing integration circuit 10, and includes a first register REG1, a second register REG2, a third register REG3, a fourth register REG4, an arithmetic module MC, a digital comparator DCP, and a digital controller DC.

The first register REG1 is coupled to the digital comparator DCP, and configured to store a predetermined count Dth. The second register REG2 is coupled to the counter CT, the digital comparator DCP and the arithmetic module MC, and configured to store the first count D11 during the first integration time T1. The digital comparator DCP is coupled to the first register REG1, the second register REG2 and the digital controller DC, and configured to compare the first count D11 with the predetermined count Dth to generate a comparison result Dresult after the first integration time T1. The digital controller DC is coupled to the digital comparator DCP, the third register REG3 and the signal amplifier CA, and configured to determine a signal gain GS11 according to the comparison result Dresult to generate a control signal CTRL indicating the signal gain GS11 to the signal amplifier CA during a first calculation time Tset. Meanwhile, the digital controller DC outputs the signal gain GS11 to the third register REG3 to store the signal gain GS11 in the third register REG3. The signal amplifier CA adjusts the first sensing signal S11 according to the signal gain GS11 to generate a second sensing signal S12, so that the sensing integration circuit 10 generates a second count D12 corresponding to the second sensing signal S12 during a second integration time T2, and the second register REG2 stores the second count D12 after the second integration time T2. The arithmetic module MC is coupled to the second register REG2, the third register REG3 and the fourth register REG4, and configured to generate an output count Dout corresponding to the first sensing signal S11 according to the second count D12 and the signal gain GS11 during a second calculation time Tout after the second integration time T2. Meanwhile, the arithmetic module MC outputs the output count Dout to the fourth register REG4 to store the output count Dout in the fourth register REG4.

Figure 4:
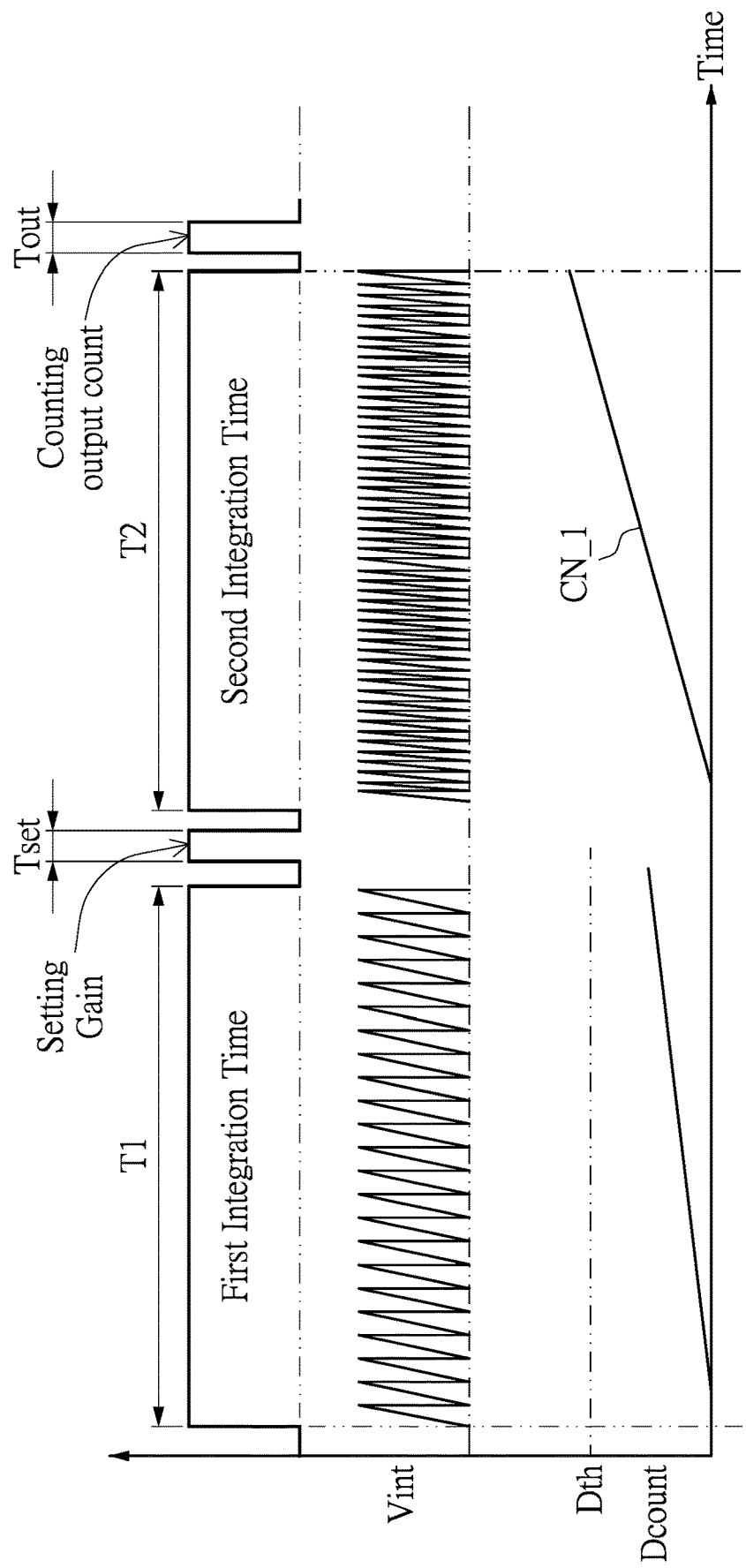
FIG. 4 is a signal timing diagram showing an integration time, a calculation time, an integral node voltage, a first count and a predetermined count according to the first embodiment of the present disclosure.

FIG. 4 is a signal timing diagram showing an integration time, a calculation time, an integral node voltage, the first count D11 and a predetermined count according to the first embodiment of the present disclosure. As shown in FIG. 3, the first sensing signal S11 charges the integral capacitor Cint to perform charging integration during the first integration time T1, a cumulative count Dcount recorded by the counter CT is added by 1 every time the integral voltage Vint ramps up to the reference voltage Vref. Therefore, a curve of the cumulative count Dcount ascends as the first integration time T1 goes by. If the cumulative count Dcount is smaller than the predetermined count Dth after the first integration time T1 elapses, then it can be inferred that the sensing integration circuit 10 is operating with the first sensing signal S11 having a small signal range. As such, there is a higher probability for the first sensing signal S11 to be affected by the noise and result in poor SNR (signal-to-noise ratio).

Therefore, in order to decrease the probability of the first sensing signal S11 being affected by the noise, during the first calculation time Tset after the first integration time T1, the digital controller DC determines that the first sensing signal S11 should be amplified (to increase a ratio of the first sensing signal S11 in the noise floor) according to the comparison result Dresult (i.e., the first count D11 is smaller than the predetermined count Dth). Accordingly, the control signal CTRL is outputted to set the gain of the signal amplifier CA, such that the signal amplifier CA generates the second sensing signal S12 having a signal strength greater than that of the first sensing signal S11. In other words, when the signal gain GS11 is greater than 1, the signal amplifier CA amplifies the first sensing signal S11 according to the signal gain GS11 to generate the second sensing signal S12, so that the second count D12 corresponding to the second sensing signal S12 is greater than the first count D11 corresponding to the first sensing signal S11.

The second sensing signal S12 charges the integral capacitor Cint to perform charging integration during the second integration time T2, and thus a curve showing the cumulative count Dcount ramps up as the second integration time T2 goes by. If the cumulative count Dcount is greater than the predetermined count Dth after the second integration time T2 elapses, then it can be inferred that the sensing integration circuit 10 was operating with the second sensing signal S12 having a great signal range. As such, there is a lower probability for the second sensing signal S12 to be affected by the noise to result in poor SNR. However, in order to reflect an actual count corresponding to the first sensing signal S11, the arithmetic module MC divides the second count D12 by the signal gain GS11 during a second calculation time Tout after the second integration time T2 elapses, so as to generate the output count Dout corresponding to the first sensing signal S11. In this way, the output count Dout corresponding to the first sensing signal S11 is reverted.

Figure 5:
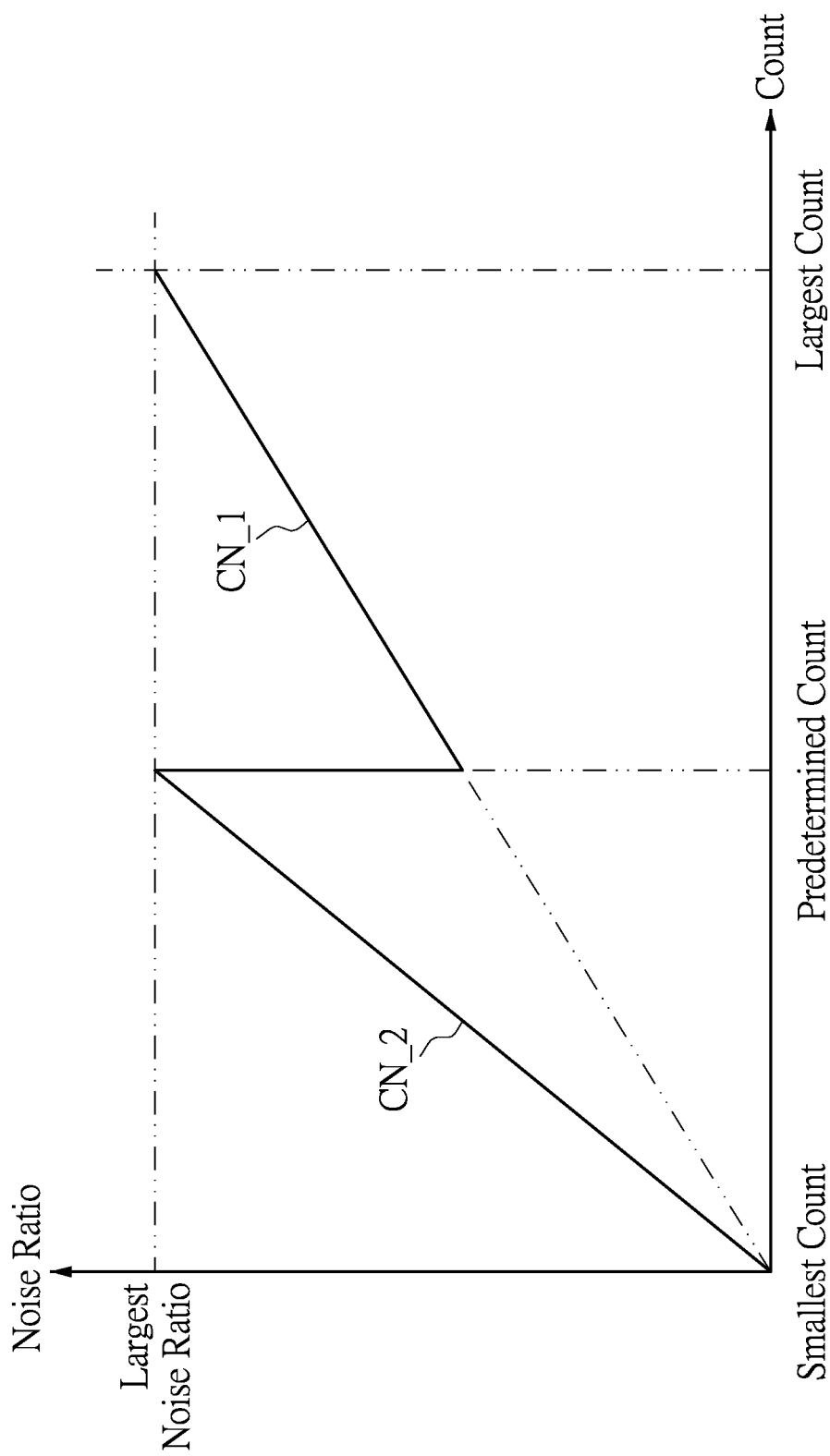
FIG. 5 is a schematic view of curves showing count versus SNR according to the first embodiment of the present disclosure.

FIG. 5 is a schematic view of curves CN_1 and CN_2 showing count versus SNR according to the first embodiment of the present disclosure. In the first embodiment, the signal gain GS11 is greater than 1 when the comparison result Dresult indicates that the first count D11 is smaller than the predetermined count Dth, and the signal gain GS11 is equal to 1 when the comparison result Dresult indicates that the first count D11 is not smaller than the predetermined count Dth. In other words, the first sensing signal S11 is amplified to be the second sensing signal S12 when the signal gain GS11 is greater than 1, so as to result in the curve CN_2 having a greater slope. In this way, the SNR of the sensing signal having a small signal strength is improved. The first sensing signal S11 remains unchanged when the signal gain GS11 is equal to 1 to result in the curve CN_1 having a smaller slope (in which a part of the curve CN_1 is the same as a corresponding part of the curve in FIG. 1). In this way, the performance of the sensing integration circuit 10 when operating with the sensing signal having a great signal strength is not affected. In other words, without affecting the performance of the sensing integration circuit 10, the signal gain determination circuit 12 of the present disclosure is capable of improving the SNR of the sensing signal having the small signal strength.

Figure 6:
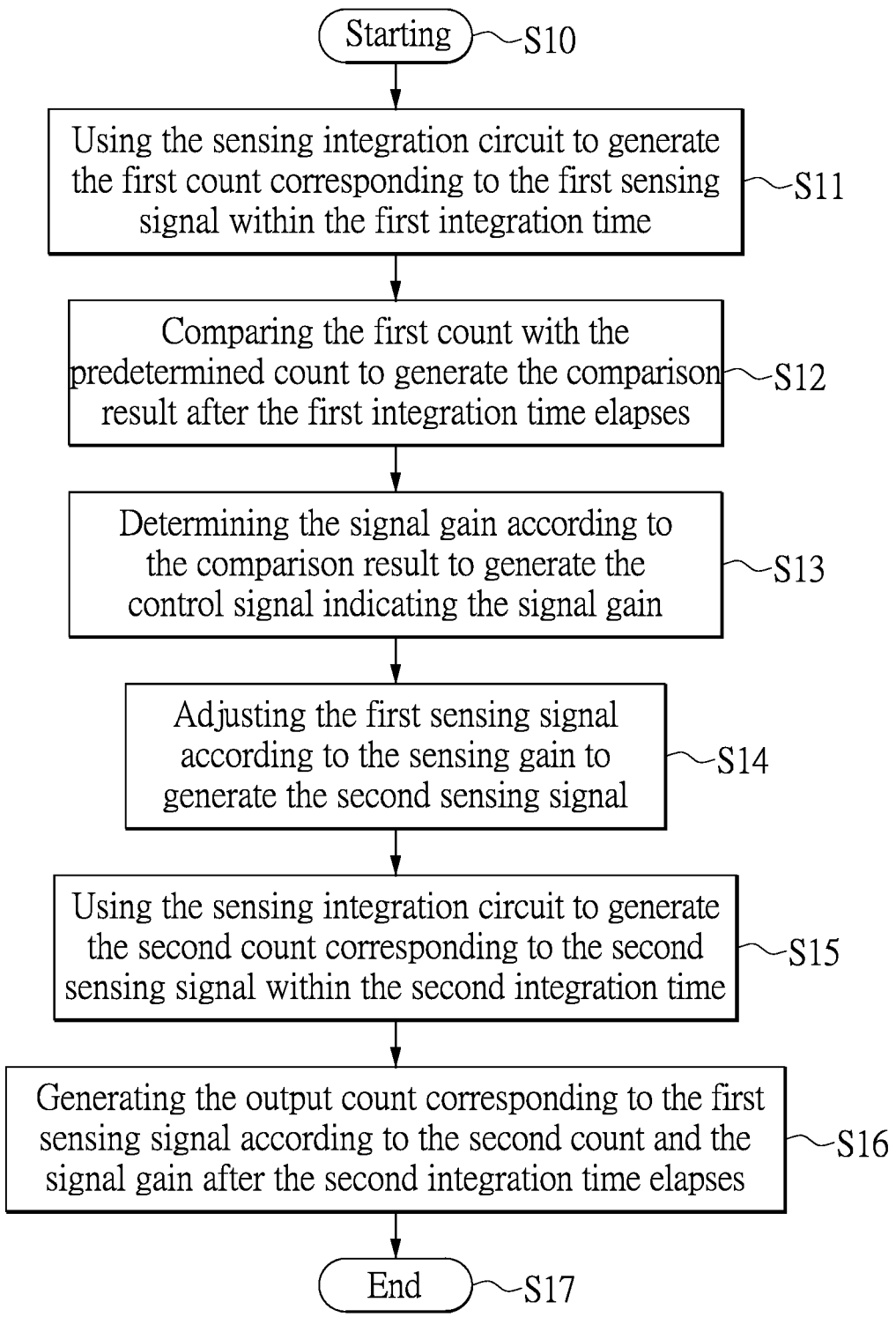
FIG. 6 is a flowchart of a process of signal gain determination according to the first embodiment of the present disclosure.

Operations of the signal gain determination circuit 12 can be summarized into a process of signal gain determination. As shown in FIG. 6, the process includes the following steps.

Step S10: Start.

Step S11: Configure a sensing integration circuit to generate a first count corresponding to a first sensing signal during a first integration time.

Step S12: Compare the first count with a predetermined count to generate a comparison result after first integration time.

Step S13: Determine a signal gain according to the comparison result to generate a control signal indicating the signal gain.

Step S14: Adjust the first sensing signal according to the signal gain to generate a second sensing signal.

Step S15: Configure the sensing integration circuit to generate a second count corresponding to the second sensing signal during a second integration time.

Step S16: Generate an output count corresponding to the first sensing signal according to the second count and the signal gain after the second integration time.

Step S17: End.

In FIG. 6, the step S11 may be performed by the sensing integration circuit 10, the step S12 may be performed by the digital comparator DCP, the step S13 may be performed by the digital controller DC, the step S14 may be performed by the signal amplifier CA, the step S15 may be performed by the sensing integration circuit 10, and the step S16 may be performed by the arithmetic module MC. Detailed descriptions regarding FIG. 6 may be obtained by referring to the descriptions regarding FIG. 1 to FIG. 5, which is not reiterated herein.

Second Embodiment

Figure 7:
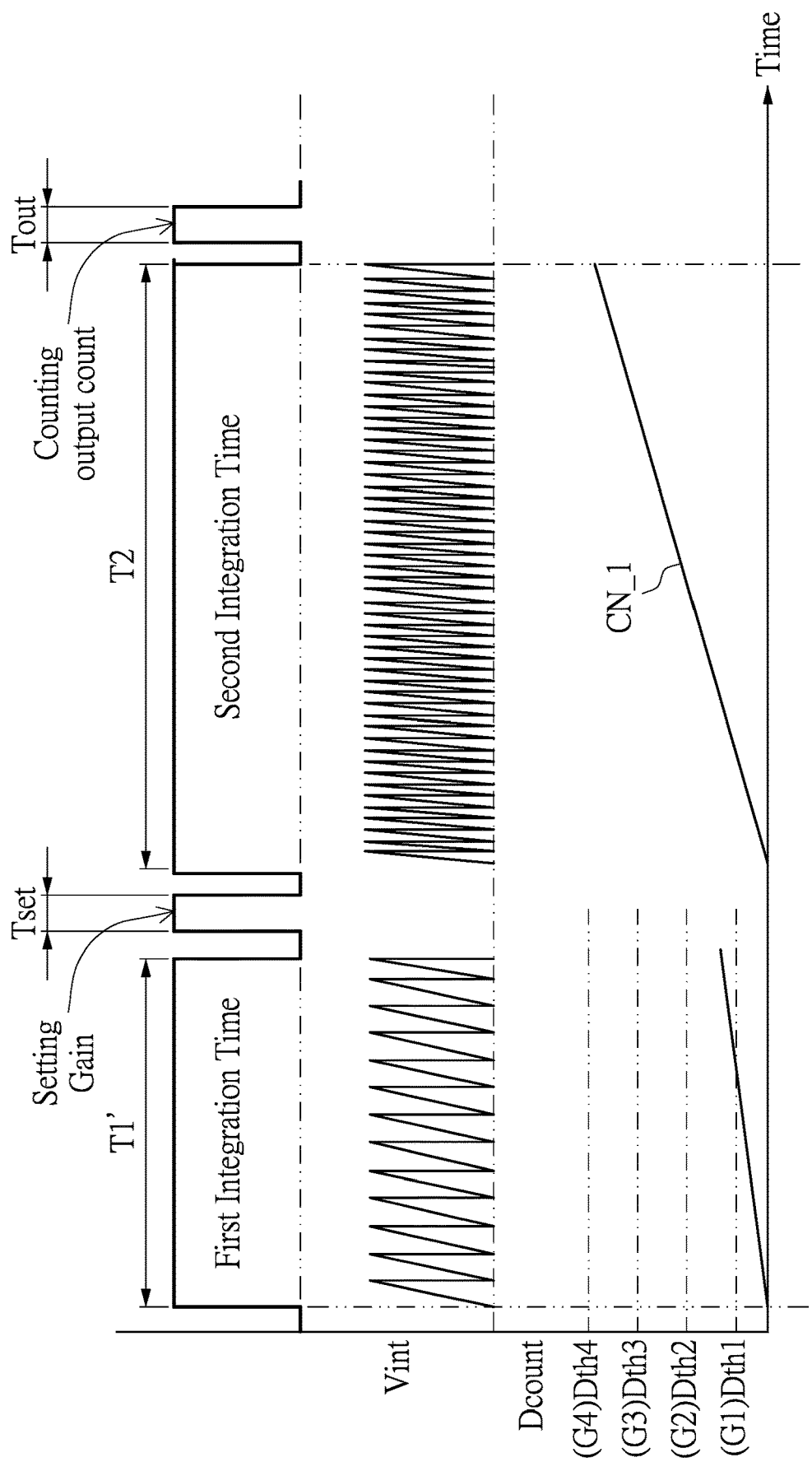
FIG. 7 is a signal timing diagram showing an integration time, a calculation time, an integral node voltage, a first count and a predetermined count according to a second embodiment of the present disclosure.

FIG. 7 is a signal timing diagram showing an integration time, a calculation time, an integral node voltage, a first count and a predetermined count according to a second embodiment of the present disclosure. Given a condition that a linearity of the sensing integration circuit 10 is within an acceptable range, when the second integration time T2 is X-times of a first integration time T1', the arithmetic module MC multiplies the second count by X-times and divides the second count by the signal gain GS11 during the second calculation time Tout after the second integration time T2, so as to generate the output count Dout corresponding to the first sensing signal S11. Here, X is a value greater than 1 For example, it can be inferred that the second integration time T2 is twice of the first integration time T1' when the value X is equal to 2, which means that the first integration time T1' is a half of the second integration time T2. Therefore, the first count D11' generated by the first sensing signal S11 during the first integration time T1' is a half of the first count D11 corresponding to the first sensing signal S11 generated during the first integration time T1. Accordingly, in order to reflect an actual count corresponding to the first sensing signal S11, the arithmetic module MC multiplies the second count D12 by X-times (e.g., 2 times) and divides the second count D12 by the signal gain GS11 during the second calculation time Tout after the second integration time T2 elapses, so as to generate the output count Dout corresponding to the first sensing signal S11. In this way, the output count Dout corresponding to the first sensing signal S11 is reverted.

From another point of view, the purpose of configuring the sensing integration circuit 10 to operate in the first integration time T1 is to determine whether the first sensing signal S11 is within the small signal range or the great signal range. In the second embodiment, by shortening the first integration time T1, a time for determining the range corresponding to the signal strength of the first sensing signal S11 can be saved, so as to generate the output count Dout corresponding to the first sensing signal S11 in a shorter period of time.

Moreover, in the second embodiment, the first register REG1 (not shown in FIG. 7) is configured to store N predetermined counts. A (M+1)-th predetermined count of the N predetermined counts is greater than an M-th predetermined count of the N predetermined counts, and the N predetermined counts respectively correspond to N signal gains, in which a (M+1)-th signal gain of the N signal gains is smaller than an M-th signal gain of the N signal gains. N and M are positive integers, and 1≤M<N. For example, a plurality of predetermined counts Dth1, Dth2, Dth3 and Dth4 are shown in FIG. 7, in which Dth1<Dth2<Dth3<Dth4. The plurality of predetermined counts Dth1, Dth2, Dth3 and Dth4 respectively correspond to a plurality of signal gains G1, G2, G3 and G4, in which G1>G2>G3>G4>1. In one embodiment, the N predetermined counts respectively correspond to a maximum count divided by N descending powers of two ($2^N$). Given that the maximum count is 800, then Dth1=800/$2^4$=50, Dth2=800/$2^3$=100, Dth3=800/$2^2$=200, and Dth4=800/$2^1$=400, but the present disclosure is not limited thereto. In one embodiment, the N signal gains are respectively N descending powers of two ($2^N$), e.g., G1=$2^4$=16, G2=$2^3$=8, G3=$2^2$=4, G4=$2^1$=2, but the present disclosure is not limited thereto.

Figure 8:
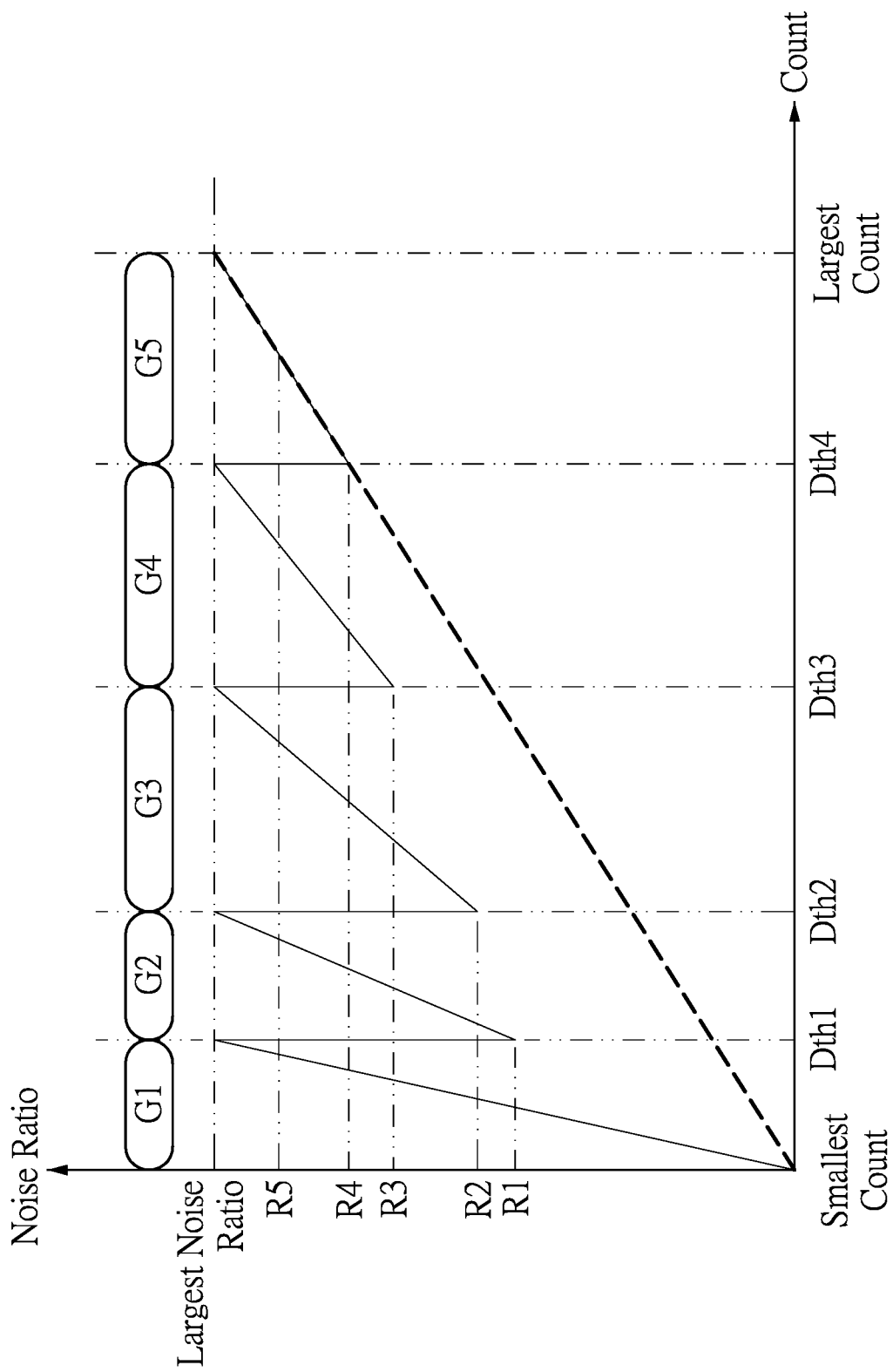
FIG. 8 is a schematic view of curves showing count versus SNR according to the second embodiment of the present disclosure.

FIG. 8 is a schematic view of curves showing count versus SNR according to the second embodiment of the present disclosure. When the first count D11 corresponding to the first sensing signal S11 is smaller than or equal to the predetermined count Dth1, an amplification magnitude corresponding to the first sensing signal S11 is a signal gain G1 and an average of SNR corresponding to the first sensing signal S11 is R1. When the first count D11 corresponding to the first sensing signal S11 is greater than the predetermined count Dth1 and smaller than or equal to the predetermined count Dth2, the amplification magnitude corresponding to the first sensing signal S11 is a signal gain G2 and an average of SNR corresponding to the first sensing signal S11 is R2. When the first count D11 corresponding to the first sensing signal S11 is greater than the predetermined count Dth2 and smaller than or equal to the predetermined count Dth3, the amplification magnitude corresponding to the first sensing signal S11 is a signal gain G3 and the averaged SNR corresponding to the first sensing signal S11 is R3. When the first count D11 corresponding to the first sensing signal S11 is greater than the predetermined count Dth3 and smaller than or equal to the predetermined count Dth4, the amplification magnitude corresponding to the first sensing signal S11 is a signal gain G4 and the averaged SNR corresponding to the first sensing signal S11 is R4. When the first count D11 corresponding to the first sensing signal S11 is greater than the predetermined count Dth4 and smaller than or equal to a maximum count, the amplification magnitude corresponding to the first sensing signal S11 is a signal gain G5 (in which G5=1) and the averaged SNR corresponding to the first sensing signal S11 is R5. As a result, in the second embodiment of the present disclosure, a plurality of SNRs of the sensing integration circuit 10 operating in a plurality of sensing signal ranges may be respectively improved by setting a plurality of predetermined counts and a plurality of signal gains corresponding to the predetermined counts.

Third Embodiment

Figure 9:
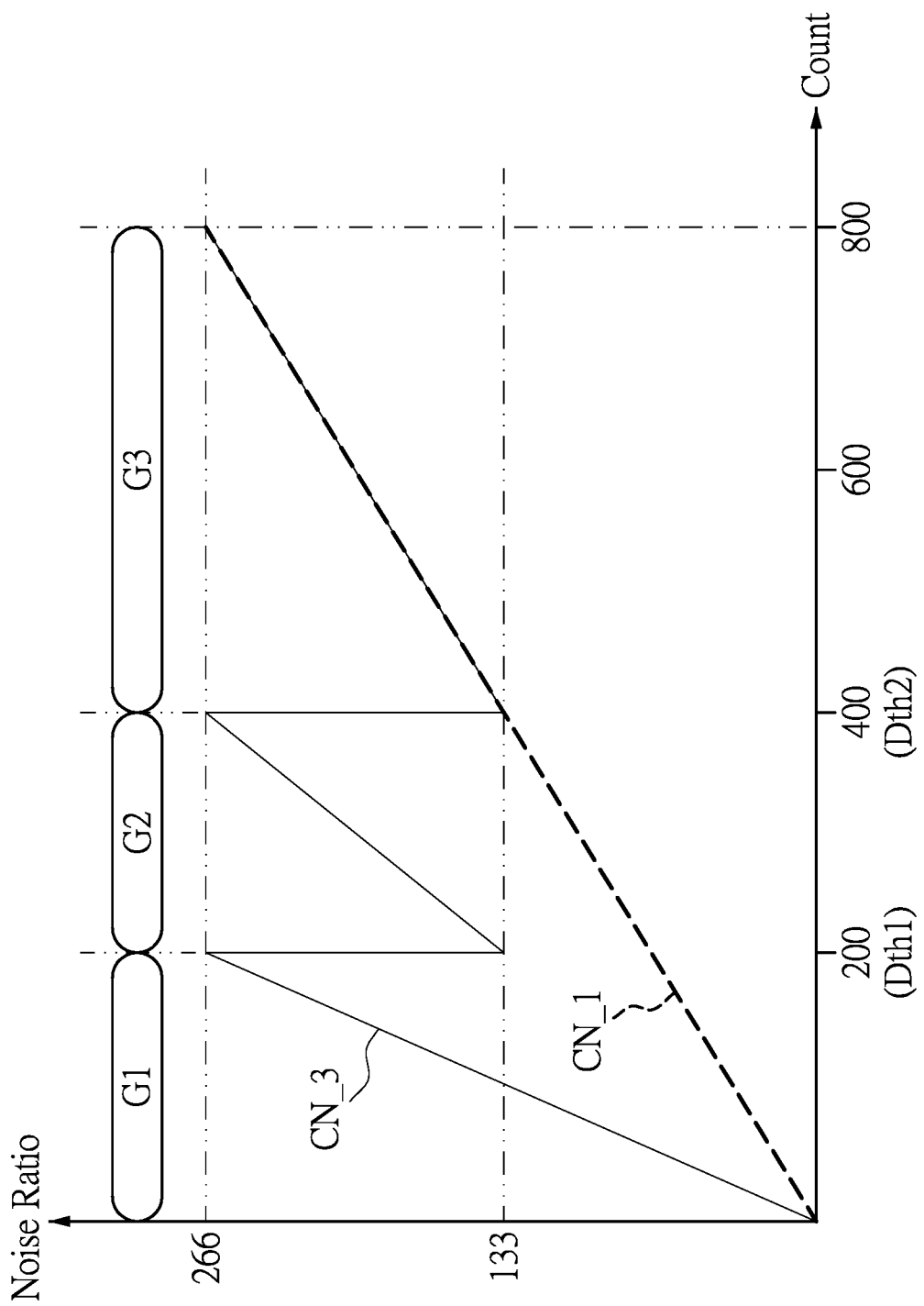
FIG. 9 is a schematic view of curves showing count versus SNR according to a third embodiment of the present disclosure.

FIG. 9 is a schematic view of curves CN_3 and CN_1 showing count versus SNR according to a third embodiment of the present disclosure. In the third embodiment, a plurality of predetermined counts are predetermined according to at least one target SNR of the sensing integration circuit 10. Specifically, in FIG. 9, given that a maximum SNR is 266 and a maximum count corresponding to the maximum SNR is 800, a target SNR is 133 and a predetermined count Dth2 corresponding to the target SNR is 400. It can be inferred from a portion of the curve CN_1 denoted with a dashed line that the SNR of the first sensing signal S11 is smaller than the target SNR 133 during the first integration time T1, and thus the first sensing signal S11 needs to be amplified to improve the SNR of the sensing integration circuit 10. In one embodiment, under a circumstance that the SNR corresponding to the first sensing signal S11 is smaller than the target SNR 133, a plurality of predetermined counts Dth1 and Dth2 and a plurality of signal gains G1 and G2 corresponding to the plurality of predetermined counts Dth1 and Dth2 (in which a signal gain G3 corresponding to the maximum SNR 266 is 1) may be set according to practical requirements. Accordingly, a plurality of SNRs of the sensing integration circuit 10 which operates within a plurality of sensing signal ranges can be respectively improved.

Figure 10:
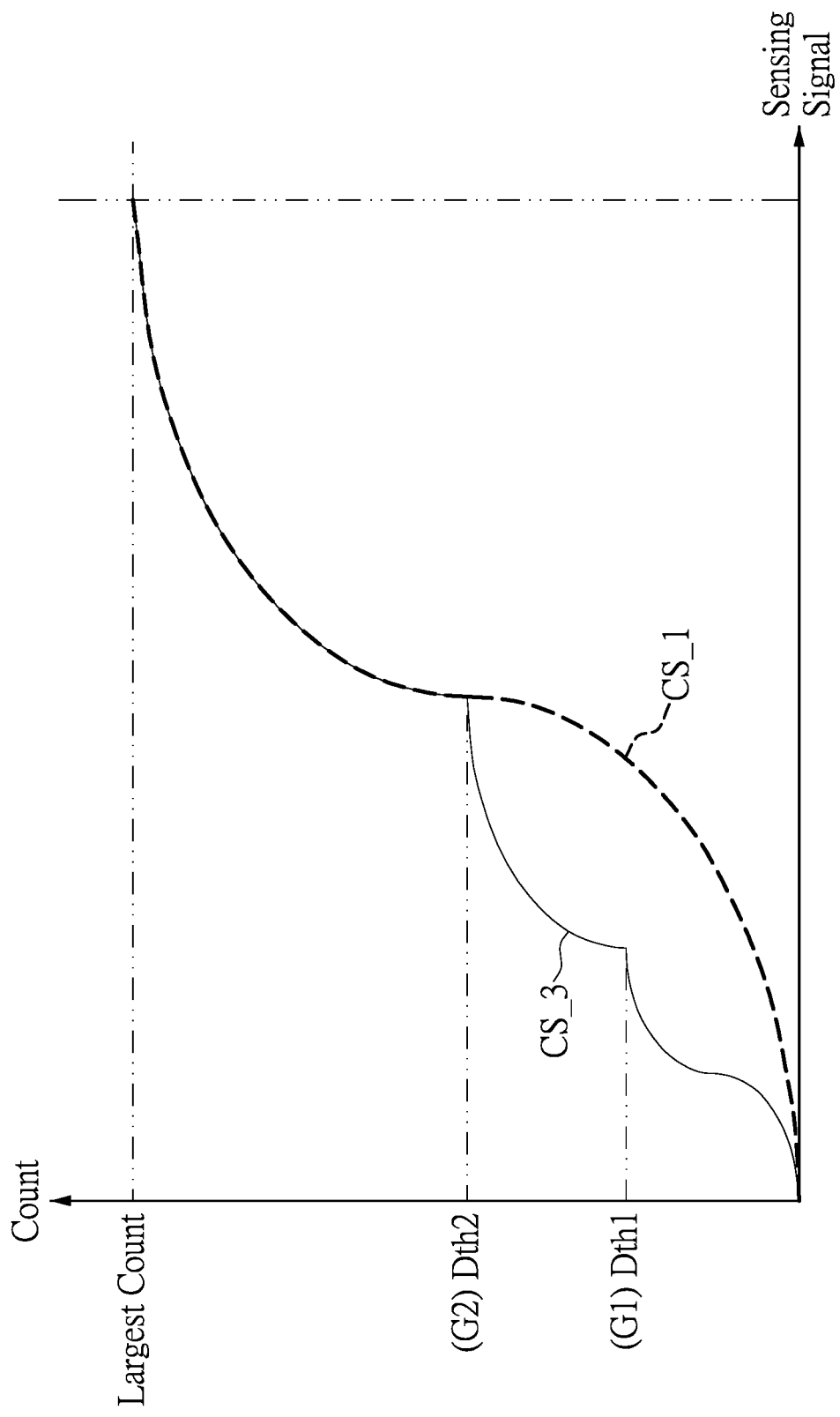
FIG. 10 is a schematic view of curves showing sensing signal versus count according to the third embodiment of the present disclosure.

FIG. 10 is a schematic view of curves CS_1 and CS_3 showing sensing signal versus count according to the third embodiment of the present disclosure. In FIG. 10, it can be inferred from a portion of the curve CS_1 denoted with a dashed line that the count and the sensing signal are not linearly proportional, namely a slope of the curve CS_1 is not constant. In order to improve the abovementioned issue, the amplification magnitude corresponding to the first sensing signal S11 is set to the signal gain G1 when the first count D11 corresponding to the first sensing signal S11 is smaller than the predetermined count Dth1. The amplification magnitude corresponding to the first sensing signal S11 is set to the signal gain G2 when the first sensing signal S11 corresponding to the first count D11 is smaller than the predetermined count Dth2 and greater than or equal to the predetermined count Dth1. As a result, it can be inferred from a portion of the curve CS_3 denoted with a solid line that the count and the sensing signal are more linearly proportional, namely, a slope of the curve CS_3 is more likely to be constant, and thus an overall linearity within all signal ranges of the sensing integration circuit 10 can be improved.

Advantageous Effects of the Embodiments

Therefore, by virtue of "comparing a first count corresponding to a first sensing signal with a predetermined count to determine a signal gain corresponding to the first sensing signal during a first integration time; adjusting the first sensing signal according to the signal gain to generate a second sensing signal; generating a second count corresponding to the second sensing signal during a second integration time; and generating an output count corresponding to the first sensing signal according to the second count and the signal gain after the second integration time", the SNR of the sensor may be uniformly distributed when the sensing integration circuit operates within a plurality of sensing signal ranges, and the linearity of the sensor within an overall operating range can be improved as well.

Further, by virtue of "configuring the arithmetic module to multiply the second count by an X-times and divide the second count by the signal gain when the second integration time is the X-times the first integration time to generate the output count corresponding to the first sensing signal after the second integration time", a time required for determining the range corresponding to the signal intensity of the first sensing signal lies can be saved, so as to generate the output count corresponding to the first sensing signal in a shorter period of time.

Further, by virtue of "predetermining N predetermined counts and N signal gains corresponding to the N predetermined counts" and "predetermining the N predetermined counts according to at least one target SNR of the sensing integration circuit", the SNR of the sensing integration circuit operating in different sensing signal ranges is evenly distributed and the linearity of the sensor in the overall operating range is improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal gain determination circuit for a sensing integration circuit, comprising:
   a first register configured to store a predetermined count;
   a second register configured to store a first count;
   wherein the sensing integration circuit generates the first count according to a first sensing signal during a first integration time;
   a digital comparator coupled to the first register and the second register, and configured to compare the first count with the predetermined count to generate a comparison result after the first integration time;
   a digital controller coupled to the digital comparator, and configured to determine a signal gain according to the comparison result so as to generate a control signal for indicating the signal gain to a signal amplifier of the sensing integration circuit;
   wherein the signal amplifier is configured to adjust the first sensing signal according to the signal gain to generate a second sensing signal, so that the sensing integration circuit is configured to generate a second count corresponding to the second sensing signal during a second integration time, and the second register is configured to store the second count after the second integration time;
   a third register coupled to the digital controller, and configured to store the signal gain;
   an arithmetic module coupled to the third register and the second register, and configured to generate an output count corresponding to the first sensing signal according to the second count and the signal gain after the second integration time; and
   a fourth register coupled to the arithmetic module, and configured to store the output count.

2. The signal gain determination circuit according to claim 1, wherein
   the signal gain is greater than 1 when the comparison result indicates that the first count is smaller than the predetermined count; and
   the signal gain is equal to 1 when the comparison result indicates that the first count is not smaller than the predetermined count.

3. The signal gain determination circuit according to claim 2, wherein the signal amplifier is configured to amplify the first sensing signal according to the signal gain to generate the second sensing signal when the signal gain is greater than 1, so that the second count corresponding to the second sensing signal is greater than the first count corresponding to the first sensing signal.

4. The signal gain determination circuit according to claim 3, wherein the arithmetic module is configured to divide the second count by the signal gain to generate the output count corresponding to the first sensing signal after the second integration time.

5. The signal gain determination circuit according to claim 3, wherein the arithmetic module is configured to multiply the second count by X-times of the first integration time and divide the second count by the signal gain when the second integration time is X-times of the first integration time, so as to generate the output count corresponding to the first sensing signal after the second integration time; wherein X is a value greater than 1.

6. The signal gain determination circuit according to claim 1, wherein the first register is configured to store N predetermined counts, and the N predetermined counts respectively correspond to N signal gains, wherein N is a positive integer.

7. The signal gain determination circuit according to claim 6, wherein
a (M+1)-th predetermined count of the N predetermined counts is greater than an M-th predetermined count of the N predetermined counts;
a (M+1)-th signal gain of the N signal gains is smaller than an M-th signal gain of the N signal gains; and
N and M are positive integers, and 1≤M<N.

8. The signal gain determination circuit according to claim 6, wherein the N predetermined counts are predetermined according to at least one target signal-to-noise ratio (SNR) of the sensing integration circuit.

9. A signal gain determination method for a sensing integration circuit, comprising:
configuring the sensing integration circuit to generate a first count corresponding to a first sensing signal during a first integration time;
comparing the first count with a predetermined count to generate a comparison result after the first integration time;
determining a signal gain according to the comparison result to generate a control signal for indicating the signal gain;
adjusting the first sensing signal according to the signal gain to generate a second sensing signal;
configuring the sensing integration circuit to generate a second count corresponding to the second sensing signal during a second integration time; and
generating an output count corresponding to the first sensing signal according to the second count and the signal gain after the second integration time.

10. The method according to claim 9, wherein the step of determining the signal gain according to the comparison result includes:
the signal gain is greater than 1 when the comparison result indicates that the first count is smaller than the predetermined count; and
the signal gain is equal to 1 when the comparison result indicates that the first count is not smaller than the predetermined count.

11. The method according to claim 10, wherein the signal amplifier is configured to amplify the first sensing signal according to the signal gain to generate the second sensing signal when the signal gain is greater than 1, so that the second count corresponding to the second sensing signal is greater than the first count corresponding to the first sensing signal.

12. The method according to claim 10, wherein the step of generating the output count corresponding to the first sensing signal according to the second count and the signal gain after the second integration time includes:
dividing the second count by the signal gain to generate the output count corresponding to the first sensing signal.

13. The method according to claim 10, wherein, when the second integration time is X-times of the first integration time, the step of generating the output count corresponding to the first sensing signal according to the second count and the signal gain after the second integration time includes:
multiplying the second count by X-times and dividing the second count by the signal gain to generate the output count corresponding to the first sensing signal, wherein X is a value greater than 1.

14. The method according to claim 9, further comprising:
configuring a first register to store the predetermined count, wherein the predetermined count includes N predetermined counts, wherein N is a positive integer.

15. The method according to claim 14, wherein
a (M+1)-th predetermined count of the N predetermined counts is greater than an M-th predetermined count of the N predetermined counts;
the N predetermined count respectively correspond to N signal gains, and a (M+1)-th signal gain of the N signal gains is smaller than an M-th signal gain of the N signal gains; and
N and M are positive integers, and 1≤M<N.

16. The method according to claim 14, further comprising:
predetermining the N predetermined counts according to at least one target signal-to-noise ratio (SNR).

* * * * *